United States Patent [19]
Tsukikawa

[11] Patent Number: 5,966,316
[45] Date of Patent: Oct. 12, 1999

[54] SEMICONDUCTOR MEMORY DEVICE HAVING STORAGE CAPACITY OF $2^{2N+1}$ BITS

[75] Inventor: Yasuhiko Tsukikawa, Hyogo, Japan

[73] Assignee: Mitsubishi Denki Kabushiki Kaisha, Tokyo, Japan

[21] Appl. No.: 09/059,202

[22] Filed: Apr. 14, 1998

[30] Foreign Application Priority Data

Nov. 7, 1997 [JP] Japan ................................... 9-305830

[51] Int. Cl.⁶ ............................... G11C 5/02; G11C 8/00
[52] U.S. Cl. ........................................ 365/51; 365/230.03
[58] Field of Search .............................. 365/230.03, 51, 365/200

[56] References Cited

U.S. PATENT DOCUMENTS

| | | | |
|---|---|---|---|
| 5,357,478 | 10/1994 | Kikuda et al. | 365/230.03 |
| 5,642,323 | 6/1997 | Kotani et al. | 365/230.03 |
| 5,771,200 | 6/1998 | Cho et al. | 365/230.03 |
| 5,867,439 | 2/1999 | Asakura et al. | 365/230.03 |

FOREIGN PATENT DOCUMENTS 6-85185  3/1994  Japan .

*Primary Examiner*—David Nelms
*Assistant Examiner*—Anh Phung
*Attorney, Agent, or Firm*—McDermott, Will & Emery

[57] ABSTRACT

A main surface of a semiconductor substrate having the aspect ratio of 1:2 is equally divided into 9 regions of 3 rows and 3 columns, and a $2^{N-2}$-bit subarray portion having the aspect ratio of 1:2 is arranged in each region other than a central region. The central region is provided with control circuitry and pads. Thus, a DRAM chip having the aspect ratio of 1:2 and the storage capacity of $2^{2N+1}$ bits can be formed. The DRAM chip can be contained at a high effective ratio in a package having the aspect ratio of 1:2 as is conventional.

6 Claims, 11 Drawing Sheets

FIG.12C  PRIOR ART

SEMICONDUCTOR MEMORY DEVICE HAVING STORAGE CAPACITY OF $2^{2N+1}$ BITS

BACKGROUND OF THE INVENTION

1. Field of the Invention

The present invention relates to a semiconductor memory device and more particularly to a semiconductor memory device having a storage capacity of $2^{2N+1}$ bits.

2. Description of the Background Art

Figure 7:
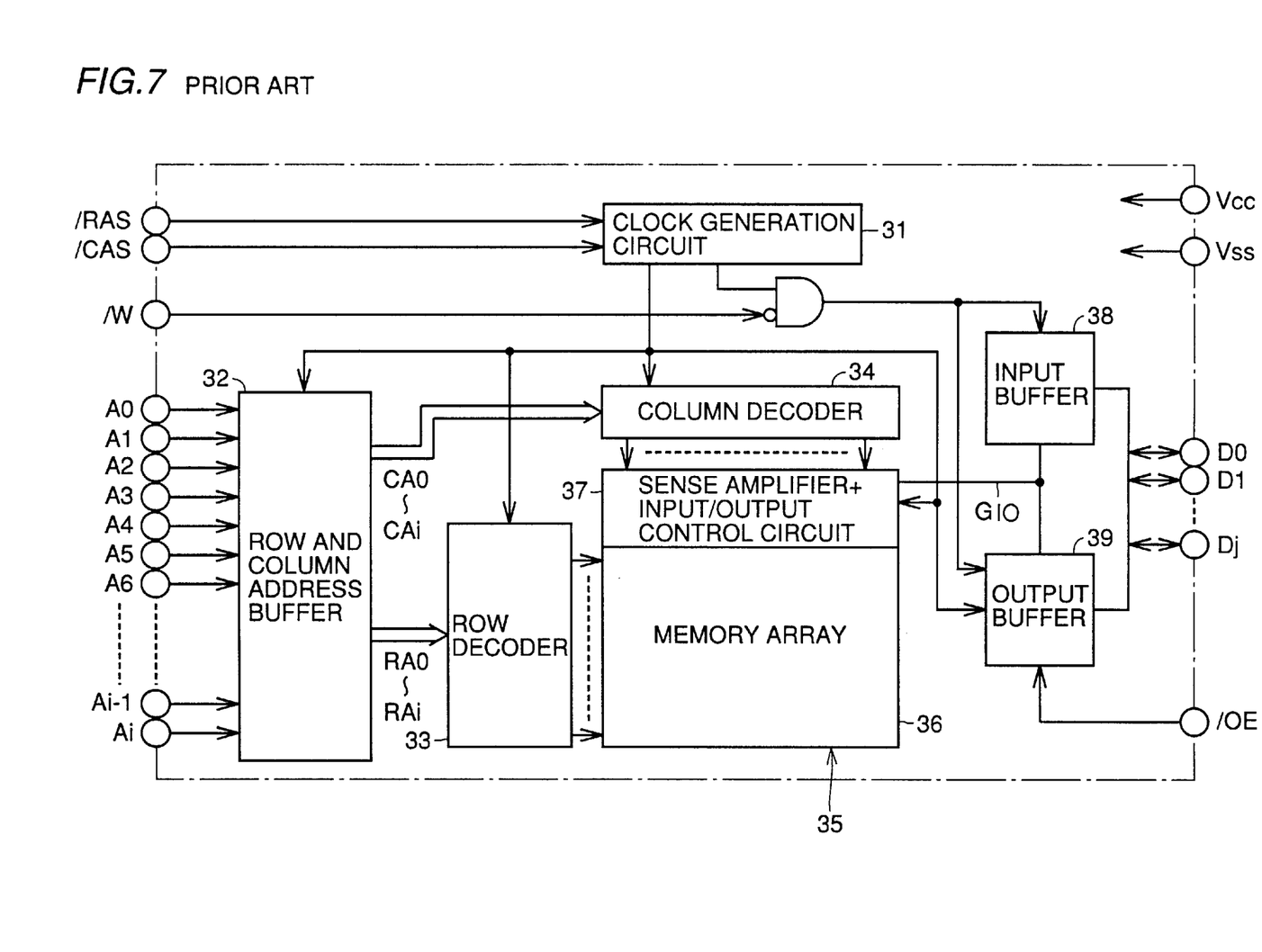
FIG. 7 is a block diagram showing the structure of a conventional DRAM.

FIG. 7 is a block diagram showing the structure of a conventional dynamic random access memory (hereinafter referred to as a DRAM). Referring to FIG. 7, the DRAM includes a clock generation circuit 31, a row and column address buffer 32, a row decoder 33, a column decoder 34, a memory mat 35, an input buffer 38 and an output buffer 39. Memory mat 35 includes a memory array 36 and a sense amplifier+input/output control circuit 37.

Clock generation circuit 31 selects a prescribed operation mode in accordance with externally applied control signals /RAS, /CAS, /W, and controls the entire DRAM.

Row and column address buffer 32 generates a row address signal RA0-RAi and a column address signal CA0-CAi in accordance with an externally applied address signal A0-Ai (i is an integer of at least 0), and applies generated signals RA0-RAi and CA0-CAi to row decoder 33 and column decoder 34, respectively.

Memory array 36 includes a plurality of memory cells each storing 1-bit data. Each memory cell is arranged at a prescribed address determined by row and column addresses.

Row decoder 33 designates a row address in memory array 36 in response to row address signal RA0-RAi applied from row and column address buffer 32. Column decoder 34 designates a column address in memory array 36 in response to column address signal CA0-CAi applied from row and column address buffer 32.

Sense amplifier+input/output control circuit 37 connects the memory cell at the address which is designated by row decoders 33 and column decoder 34 to one end of a global data input/output line pair GIO. The other end of global data input/output line pair GIO is connected to input buffer 38 and output buffer 39. In the write mode, input buffer 38 applies, in response to control signal /W, data Dj which is externally received (j is an integer of at least 0) to a selected memory cell through global data input/output line pair GIO. In the read mode, output buffer 39 outputs, in response to a control signal /OE which is externally received, read data Dj from a selected memory cell to the outside.

Figure 8:
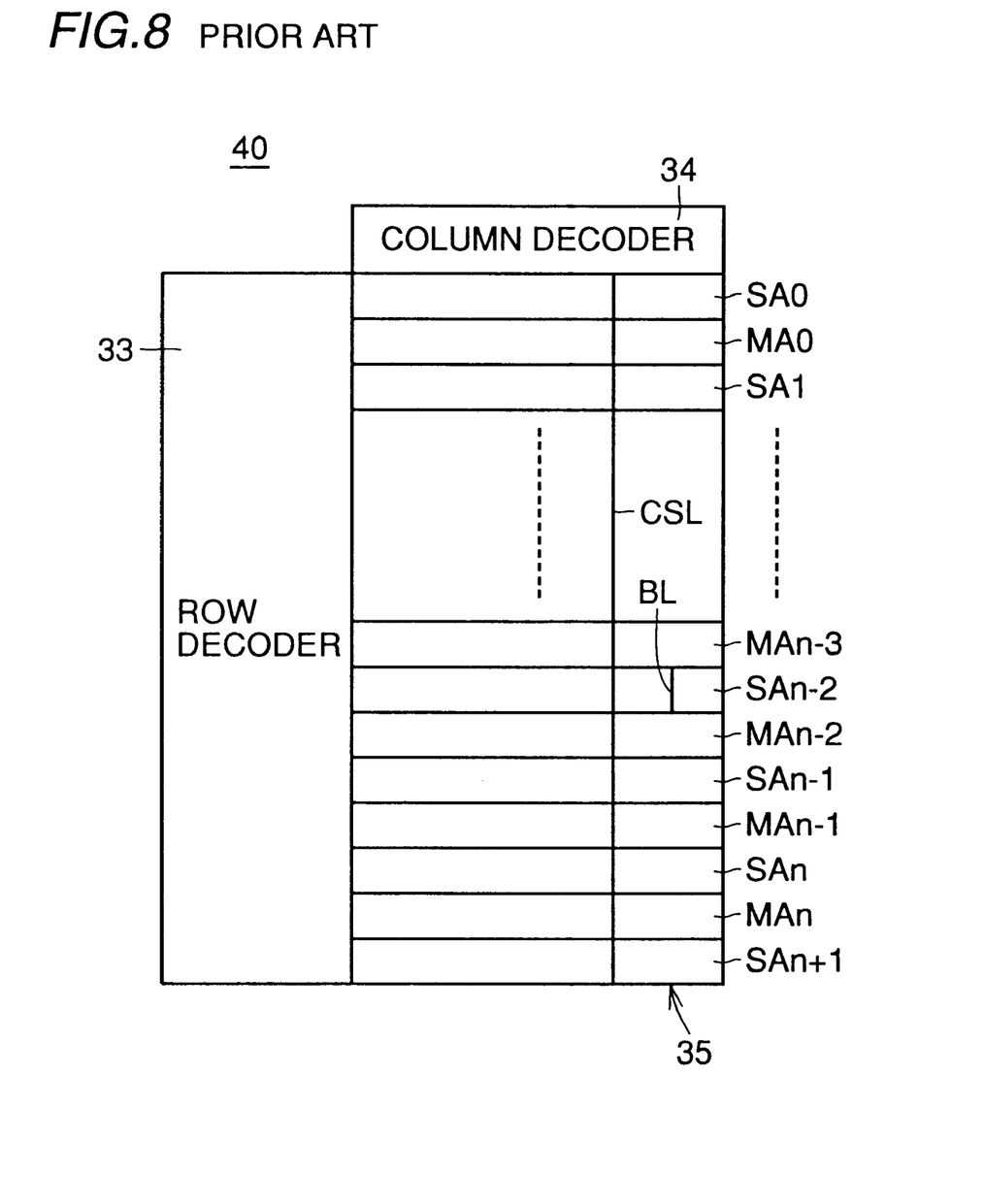
FIG. 8 shows a chip layout of a row decoder, a column decoder and a memory mat shown in FIG. 7.

FIG. 8 shows a chip layout of the DRAM shown in FIG. 7. Referring to FIG. 8, memory mat 35 is generally arranged in a rectangular region. Memory array 36 is divided into a plurality of memory array blocks MA0–MAn (n is an integer of at least 0), and sense amplifier+input/output control circuit 37 is divided into a plurality of sense amplifier bands SA0–SAn+1. Memory array blocks MA0–MAn and sense amplifier bands SA0–SAn+1 are arranged in the rectangular region in the direction of its longer side, with memory array blocks MA0–MAn each arranged between sense amplifier bands SA0–SAn+1.

Row decoder 33 is arranged along one longer side of rectangular memory mat 35, and column decoder 34 is arranged along one shorter side of memory mat 35. Memory mat 35, row decoder 33 and column decoder 34 constitute an array portion 40. Control circuitry other than array portion 40, that is, clock generation circuit 31, row and column address buffer 32, input buffer 38 and output buffer 39, and pads for receiving and outputting control signals /RAS, /CAS, /W, /OE, address signal A0-Ai, data signal D0-Dj or the like are arranged in the periphery of array portion 40.

Figure 9:
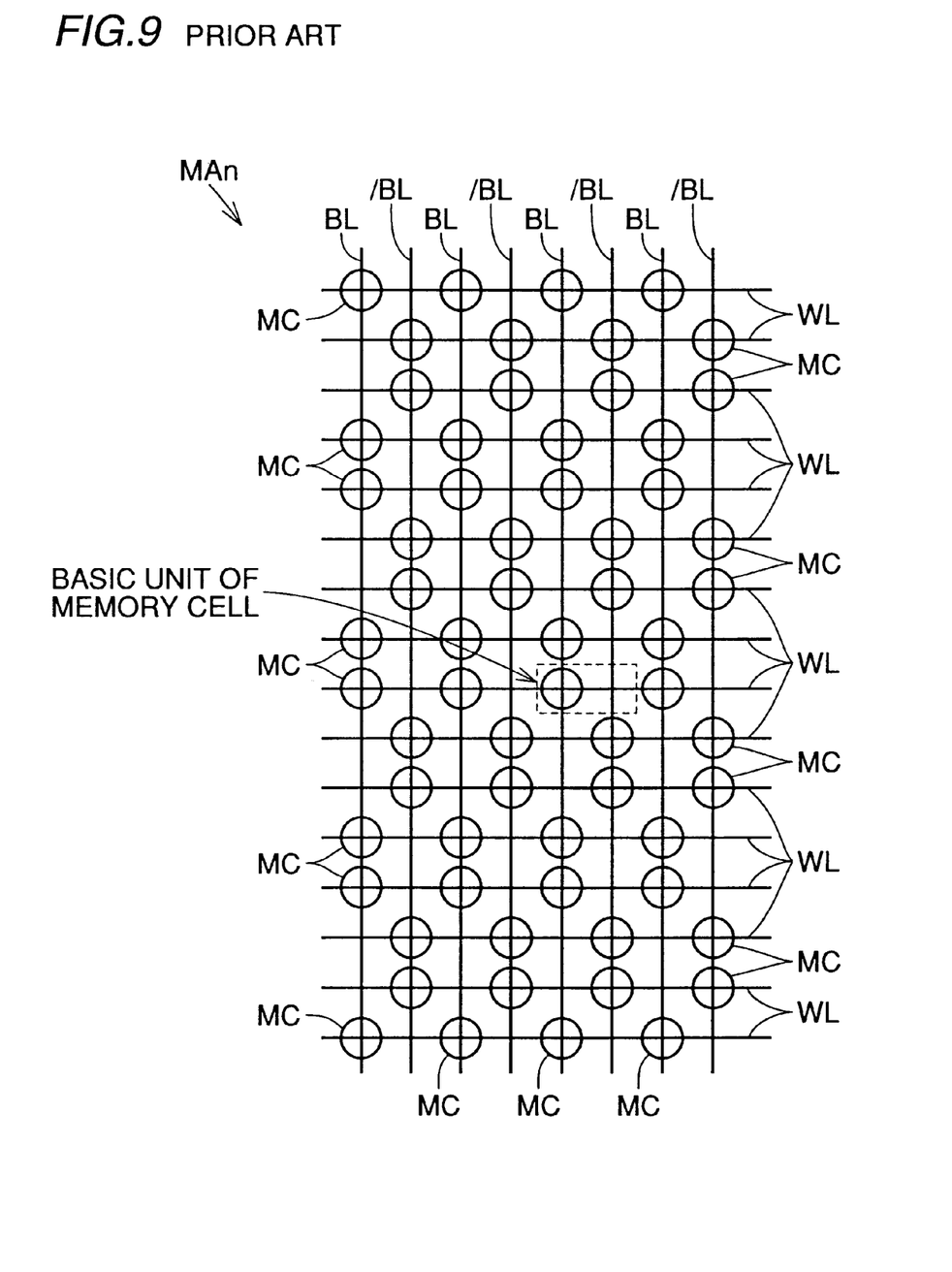
FIG. 9 shows in detail the structure of a memory array block shown in FIG. 8.

FIG. 9 illustrates part of memory array block MAn shown in FIG. 8. Referring to FIG. 9, memory array block MAn includes a plurality of memory cells MC arranged in a matrix, a word line WL provided corresponding to each row, and a bit line pair BL, /BL provided corresponding to each column. One memory cell MC is arranged at one of the two crossings of two bit lines BL, /BL and one word line WL which orthogonally crosses them.

Figure 10:
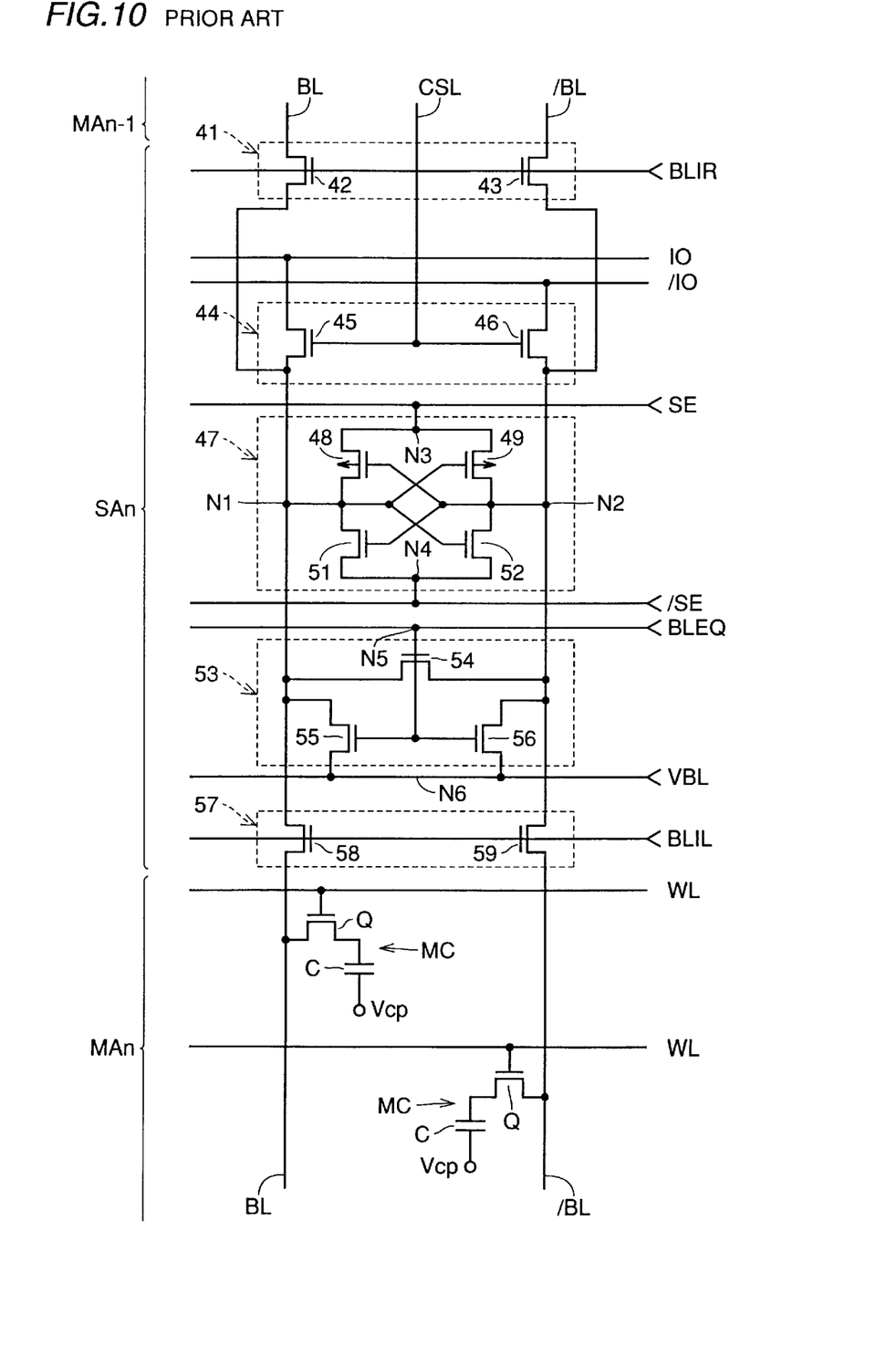
FIG. 10 is a circuit diagram showing in detail a memory array block and a sense amplifier band shown in FIG. 8.

As shown in FIG. 10, each memory cell MC includes an N channel MOS transistor Q for accessing and a capacitor C for storing information. N channel MOS transistor Q and capacitor C are connected in series between corresponding bit line BL or /BL and the line of a cell potential Vcp, and the gate of N channel MOS transistor Q is connected to corresponding word line WL.

As shown in FIG. 10, sense amplifier band SAn includes transfer gates 41, 57, a column selection gate 44, a sense amplifier 47 and an equalizer 53 which are provided corresponding to each odd column of memory array block MAn. Transfer gates 41, 57, column selection gate 44, sense amplifier 47 and equalizer 53 for each even column of memory array block MAn are provided in sense amplifier band SAn+1.

Transfer gate 41 includes N channel MOS transistors 42, 43. N channel MOS transistors 42, 43 are connected between input/output nodes N1, N2 of sense amplifier 47 and corresponding bit lines BL, /BL, respectively. Their gates receive a block selection signal BLIR.

Transfer gate 57 includes N channel MOS transistors 58, 59. N channel MOS transistors 58, 59 are connected between input/output nodes N1, N2 and corresponding bit lines BL, /BL, respectively. Their gates receive a block selection signal BLIL.

The circuit in sense amplifier band SAn is shared by two memory array blocks MAn−1, MAn on the both sides of sense amplifier band SAn. When memory array block MAn−1 is selected, signal BLIR is at the L level to cut off transfer gate 41. When memory array block MAn is selected, signal BLIL is at the L level to cut off transfer gate 57.

Column selection gate 44 includes N channel MOS transistors 45, 46 which are connected between input/output nodes N1, N2 and data input/output lines IO, /IO, respectively. The gates of N channel MOS transistors 45, 46 are connected to column decoder 34 through a column selection line CSL. When the potential of column selection line CSL is raised to the H level selected state by column decoder 34, N channel MOS transistors 45, 46 are rendered conductive, connecting input/output nodes N1, N2, that is, bit line pair BL, /BL of memory array block MAn−1 or MAn to data input/output line pair IO, /IO. The other end of data input/output line pair IO, /IO is connected to one end of global data input/output line pair GIO through a block selection switch, not shown.

Sense amplifier 47 includes P channel MOS transistors 48, 49 connected between each one of input/output nodes N1, N2 and a node N3, and N channel MOS transistors 51, 52 connected between each one of input/output nodes N1, N2 and a node N4. The gates of MOS transistors 48, 51 are both connected to node N2, and the gates of MOS transistors 49, 52 are both connected to node N1. Nodes N3, N4 receive sense amplifier activation signals SE, /SE, respectively.

When sense amplifier activation signals SE, /SE attain the H and L levels, respectively, sense amplifier 47 amplifies, to a power supply voltage Vcc, a slight potential difference between nodes N1, N2, that is, between bit lines BL, /BL of memory array block MAn-1 or MAn, in response.

Equalizer 53 includes an N channel MOS transistor 54 connected between input/output nodes N1, N2, and N channel MOS transistors 55, 56 connected between each one of input/output nodes N1, N2 and a node N6. The gates of N channel MOS transistors 54–56 are all connected to a node N5. Node N5 receives a bit line equalize signal BLEQ, and node N6 receives a precharge potential VBL (=Vcc/2). When bit line equalize signal BLEQ attains the H level active state, equalizer 53 equalizes, to precharge potential VBL, a potential difference between nodes N1, N2, that is, a potential difference between bit lines BL, /BL of memory array block MAn-1 or MAn, in response. Here, signals BLIR, BLIL, SE, /SE, BLEQ and precharge potential VBL are supplied from clock generation circuit 31 in FIG. 7.

The operation of the DRAM shown in FIGS. 7–10 will be briefly described below. At the time of standby, signals BLIR, BLIL, BLEQ are all at the H level and signals SE, /SE are both at the intermediate level (Vcc/2), so that bit lines BL, /BL have been equalized to precharge potential VBL. Further, word line WL and column selection line CSL are at the L level non-selected state.

In the write mode, bit line equalize signal BLEQ is first lowered to the L level, stopping equalization of bit lines BL, /BL. Then, row decoder 33 selects memory array block MAn, for example, in response to the row address signal, and drives signals BLIR, BLIL to the L and H levels, respectively, connecting memory array block MAn and sense amplifier bands SAn, SAn+1. Further, row decoder 33 raises the potential of word line WL of a row corresponding to the row address signal to the H level selected state, rendering conductive N channel MOS transistor Q of memory cell MC of that row.

Then, column decoder 34 raises the potential of column selection line CSL of a column corresponding to the column address signal to the H level active state, rendering column selection gate 44 conductive. Externally applied write data Dj is supplied through input buffer 38, global data input/output line pair GIO and data input/output line pair IO, /IO to bit line pair BL, /BL of a selected column. Write data Dj is applied as a potential difference between bit lines BL, /BL. Capacitor C of a selected memory cell MC stores electric charges of the amount corresponding to the potential of bit line BL or /BL.

In the read mode, bit line equalize signal BLEQ is first lowered to the L level, stopping equalization of bit lines BL, /BL. Similarly to the write mode, row decoder 33 selects memory array block MAn, for example, connecting memory array block MAn and sense amplifier bands SAn, SAn+1 and raising the potential of word line WL of a row corresponding to the row address signal to the H level selected state. The potentials of bit lines BL, /BL are slightly changed in accordance with the amount of electric charges of capacitor C in the activated memory cell MC.

Then, sense amplifier activation signals SE, /SE attain the H and L levels, respectively, and sense amplifier 47 is activated. When the potential of bit line BL is slightly higher than the potential of bit line /BL, the resistance values of MOS transistors 48, 52 become lower than the resistance values of MOS transistors 49, 51. Thus, the potential of bit line BL is raised to the H level and the potential of bit line /BL is lowered to the L level. On the contrary, when the potential of bit line /BL is slightly higher than the potential of bit line BL, the resistance values of MOS transistors 49, 51 become lower than the resistance values of MOS transistors 48, 52. Thus, the potential of bit line /BL is raised to the H level and the potential of bit line BL is lowered to the L level.

Then, column decoder 34 raises the potential of column selection line CSL of a column corresponding to the column address signal to the H level selected state, rendering conductive column selection gate 44 of that column. Data Dj of bit line pair BL, /BL of the selected column is externally output through column selection gate 44, data input/output line pair IO, /IO, global data input/output line pair GIO and output buffer 39.

Now, the storage capacity of such a DRAM has increased for each generation. Specifically, the storage capacity of the DRAM has increased four times in each generation, starting from 16 K bits to 64K, to 256K, to 1M, to 4M, to 16M, and to 64M bits. Since $1K=2^{10}$, the storage capacity of the DRAM is $16K=2^{14}$, $64K=2^{16}$, $256K=2^{18}$, $1M=2^{20}$, $4M=2^{22}$, $16M=2^{24}$ or $64M=2^{26}$ bits. In short, the storage capacity is $2^{2N}$ bits (N is a natural number).

As shown in FIG. 9, in the DRAM, one memory cell MC is arranged at one of the two crossings of two bit lines BL, /BL and one word line WL which orthogonally crosses them. Since the pitch of bit lines BL, /BL is almost the same as the pitch of word lines WL, the basic unit of memory cell MC has the aspect ratio of approximately 1:2 (longitudinal to lateral).

Thus, the storage capacity of the DRAM is $2^{2N}$ bits and the basic unit of a memory cell has the aspect ratio of 1:2. When the area of a square which is half of the basic unit of the memory cell is S, the area of $2S \times 2^{2N} = S \times 2^{2N+1}$ in the entire DRAM is occupied by memory cells MC. In order to arrange the $2^{2N+1}$ squares, conventionally, $2^N$ squares are arranged longitudinally (or laterally) and $2^{N+1}$ squares are arranged laterally (or longitudinally) so that the entire DRAM chip has the aspect ratio of approximately 2:1. There have been various methods for arranging in this manner.

Figure 11A:
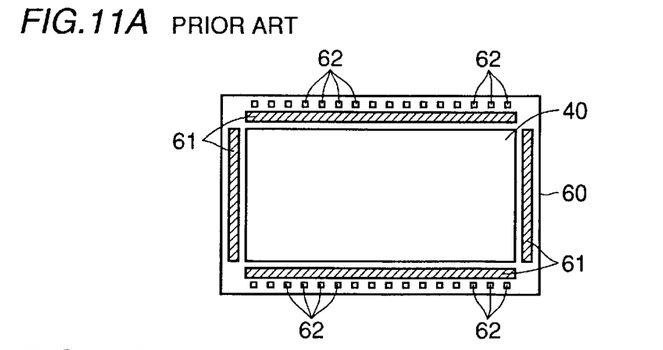
FIGS. 11A–11D are plan views illustrating a chip layout of a $2^{2N}$-bit DRAM.

As one method, as shown in FIG. 11A, an array portion 40 consisting of $2^N \times 2^{N+1}$ (longitudinal×lateral) squares each having the area of S is arranged at the center of a rectangular semiconductor substrate 60, and control circuitry 61 and pads 62 are distributed around array portion 40.

The method was also described with respect to FIG. 8. In FIG. 8, array portion 40 includes not only memory array blocks MA0–MAn but sense amplifier bands SA0–SAn+l, row decoder 33 and column decoder 34. However, almost all the area of array portion 40 is occupied by memory array blocks MA0–MAn, that is, memory cells MC.

Figure 11B:
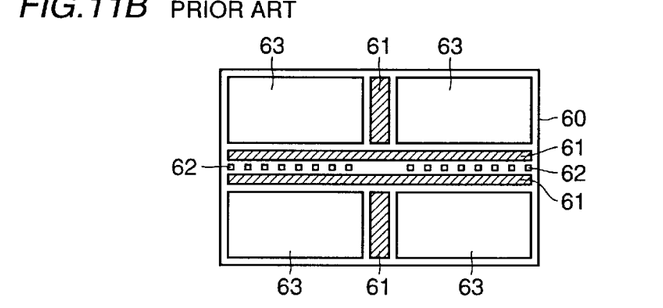

As another method, as shown in FIG. 11B, array portion 40 is equally divided into four subarray portions 63 each consisting of $2^{N-1} \times 2^N$ (longitudinal×lateral) squares, the four subarray portions 63 are arranged at the four corners of semiconductor substrate 60, and control circuitry 61 and pads 62 are distributed in the cross-shaped region defined by four subarray portions 63 therebetween. Dividing array portion 40 into a plurality of subarray portions can achieve higher operation speed, lower power consumption and so on.

Figure 11C:
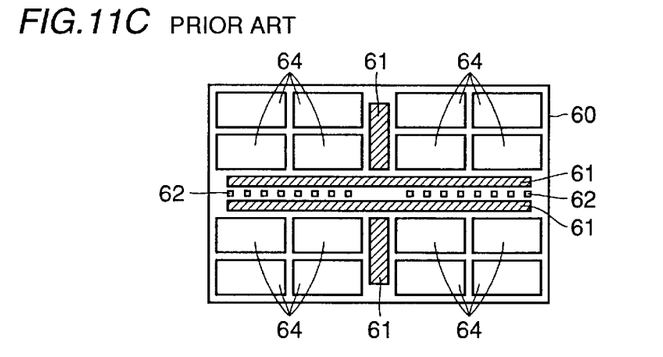

As still another method, as shown in FIG. 11C, each one of four subarray portions 63 shown in FIG. 11B is divided into four subarray portions 64 each consisting of $2^{N-2} \times 2^{N-1}$ (longitudinal×lateral) squares with the area S.

Figure 11D:
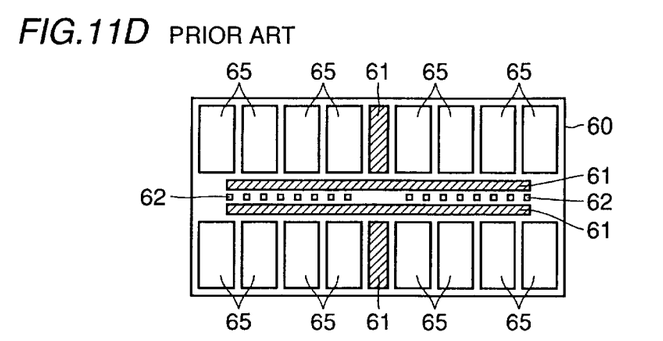

As another attempt, as shown in FIG. 11D, each one of four subarray portions 63 shown in FIG. 11B is divided into four subarray portions 65 each consisting of $2^{N-1} \times 2^{N-2}$ (longitudinal×lateral) squares with the area of S.

In all of these methods, one or an even number of array portions 30 or subarray portions 63–65 are arranged longitudinally and laterally.

Since pads 62 and control circuitry 61 are distributed in the entire periphery of semiconductor substrate 60 or in the entire region which transverses longitudinally and laterally the center of semiconductor substrate 60, the longitudinal and lateral sizes of the DRAM chip are the sum of the size of array portion 40 (or subarray portions 63–65) and the sizes of pads 62 and control circuitry 61.

Figure 12A:
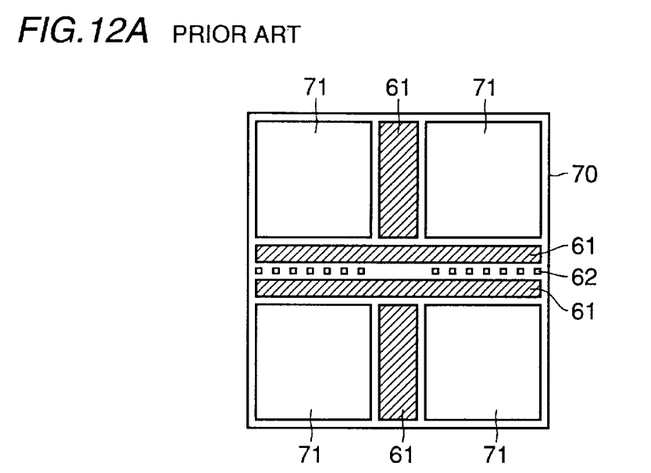
FIGS. 12A–12C are plan views illustrating a chip layout of a $2^{2N+1}$-bit DRAM.
Figure 12B:
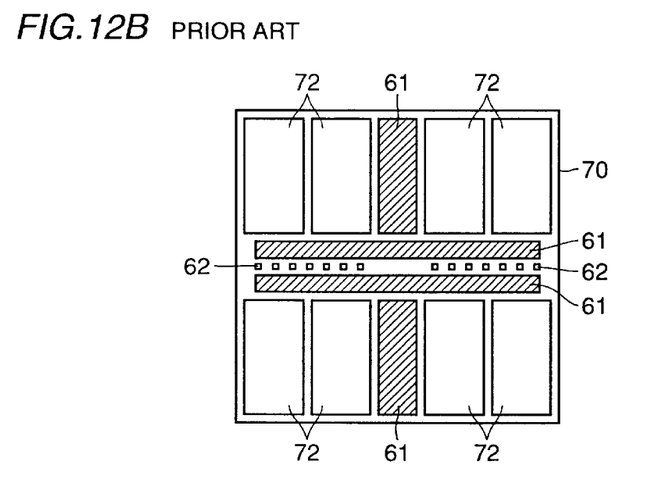
Figure 12C:
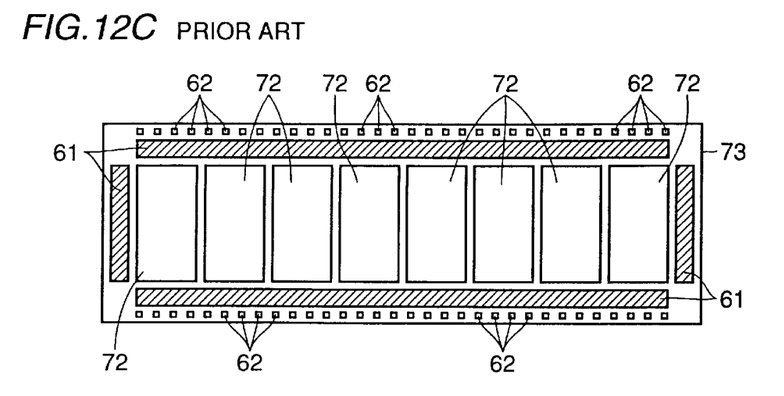

So far, the storage capacity of the DRAM has been $2^{2N}$ bits. However, since there is no particular reason for limiting the storage capacity to $2^{2N}$ bits, a DRAM of $2^{2N+1}$ bits may be supplied according to the market demand. If so, the entire memory cell has the area of $S \times 2^{2N+}$. Therefore, if one or an even number of subarray portions are arranged longitudinally and laterally as is conventional, the aspect ratio of the DRAM chip comes to be 1:1 or 1:4 as shown in FIGS. 12A–12C. The aspect ratio of 1:2 cannot be achieved.

If four subarray portions 71 each consisting of $2^{N+1} \times 2^{N+1}$ squares with the area S are arranged at the four corners of semiconductor substrate 70, and control circuitry 61 and pads 62 are distributed among four subarray portions 71, the aspect ratio of the DRAM chip is 1:1.

As shown in FIG. 12B, even if each one of four subarray portions 71 is divided into two subarray portions 72 each consisting of $2^{N+1} \times 2^{N}$ squares, the aspect ratio of the DRAM chip is 1:1.

As shown in FIG. 12C, if eight subarray portions 72 shown in FIG. 12B are arranged in one row, and control circuitry 61 and pads 62 are distributed around them, the aspect ratio of the DRAM chip is 1:4.

Since a DRAM chip has been enclosed in a rectangular package having the aspect ratio of approximately 1:2 for commercialization, a chip needs to be enclosed in the rectangular package having the aspect ratio of approximately 1:2 even if a DRAM chip of $2^{2N+1}$ bits is to be commercialized. By the methods of arrangement shown in FIGS. 12A–12C, however, the effective ratio of the chip area to the package area is about 50%, undesirably resulting in a larger package size.

For enclosing the DRAM chip in a smaller package, it is not preferred that the longitudinal and lateral sizes of the chip are the sum of the sizes of the array portion or subarray portions, pads 62 and control circuitry 61.

Accordingly, a main object of the present invention is to provide a semiconductor memory device which can be contained at a high effective ratio in a package having the aspect ratio of 1:2 and in which the longitudinal and lateral sizes of a chip are determined only by the size of a memory array.

According to an aspect of a semiconductor memory device of the present invention, a main surface of a rectangular semiconductor substrate is equally divided into 9 regions of 3 rows and 3 columns, and a memory array having the aspect ratio of 1:2 and the storage capacity of $2^{2N-2}$ bits is provided in each region other than a central region. Therefore, a memory chip having the aspect ratio of 1:2 and the storage capacity of $2^{2N+1}$ bits can be formed, and as is conventional, it can be contained at a high effective ratio in a package having the aspect ratio of 1:2. Further, by arranging control circuitry or the like in the central region of the semiconductor substrate, a smaller chip can be obtained without a possibility that the dimensions of control circuitry or the like influence, as is conventional, the longitudinal and lateral sizes of the chip.

Preferably, each memory array is divided into a plurality of subarray portions. Therefore, higher operation speed and lower power consumption can be achieved.

Preferably, control circuitry are formed at the center of the central region of the semiconductor substrate, and pads are provided in a periphery of the central region. Therefore, the control circuitry and the pads can be arranged compactly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
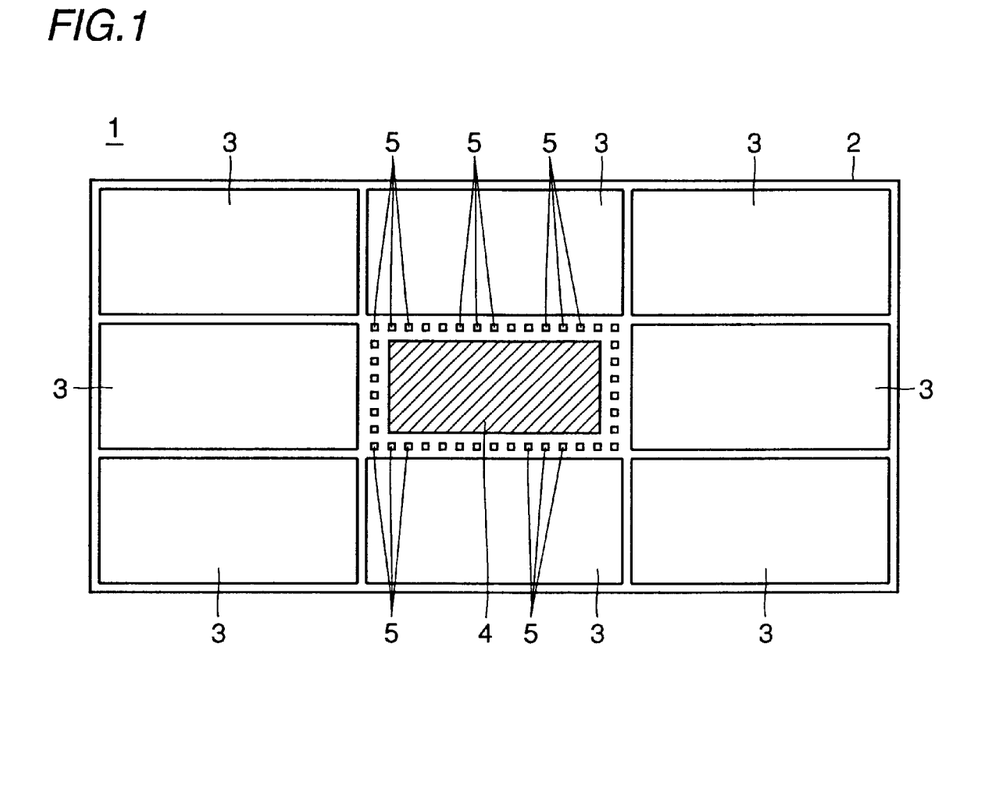
FIG. 1 is a plan view showing the structure of a DRAM chip according to one embodiment of the present invention.

FIG. 1 is a plan view showing the structure of a DRAM chip 1 according to one embodiment of the present invention. Referring to FIG. 1, in DRAM chip 1, a main surface of a semiconductor substrate 2 having the aspect ratio of 1:2 is equally divided into 9 regions of 3 rows and 3 columns with each region having the aspect ratio of 1:2.

The DRAM has the storage capacity of $2^{2N+1}$ bits as described above, and the area of an array portion, that is, the entire area of a memory cell MC is $S \times 2^{2N+2}$. The array portion is divided into eight subarray portions 3 each consisting of $2^{N-1} \times 2^{N}$ (longitudinal×lateral) squares with the area S.

Eight subarray portions 3 are arranged in eight regions of the 9 regions of 3 rows and 3 columns except the central region. Control circuitry 4 are converged and arranged at the center of the central region, and pads 5 are placed around control circuitry 4.

Figures 2A, 2B:
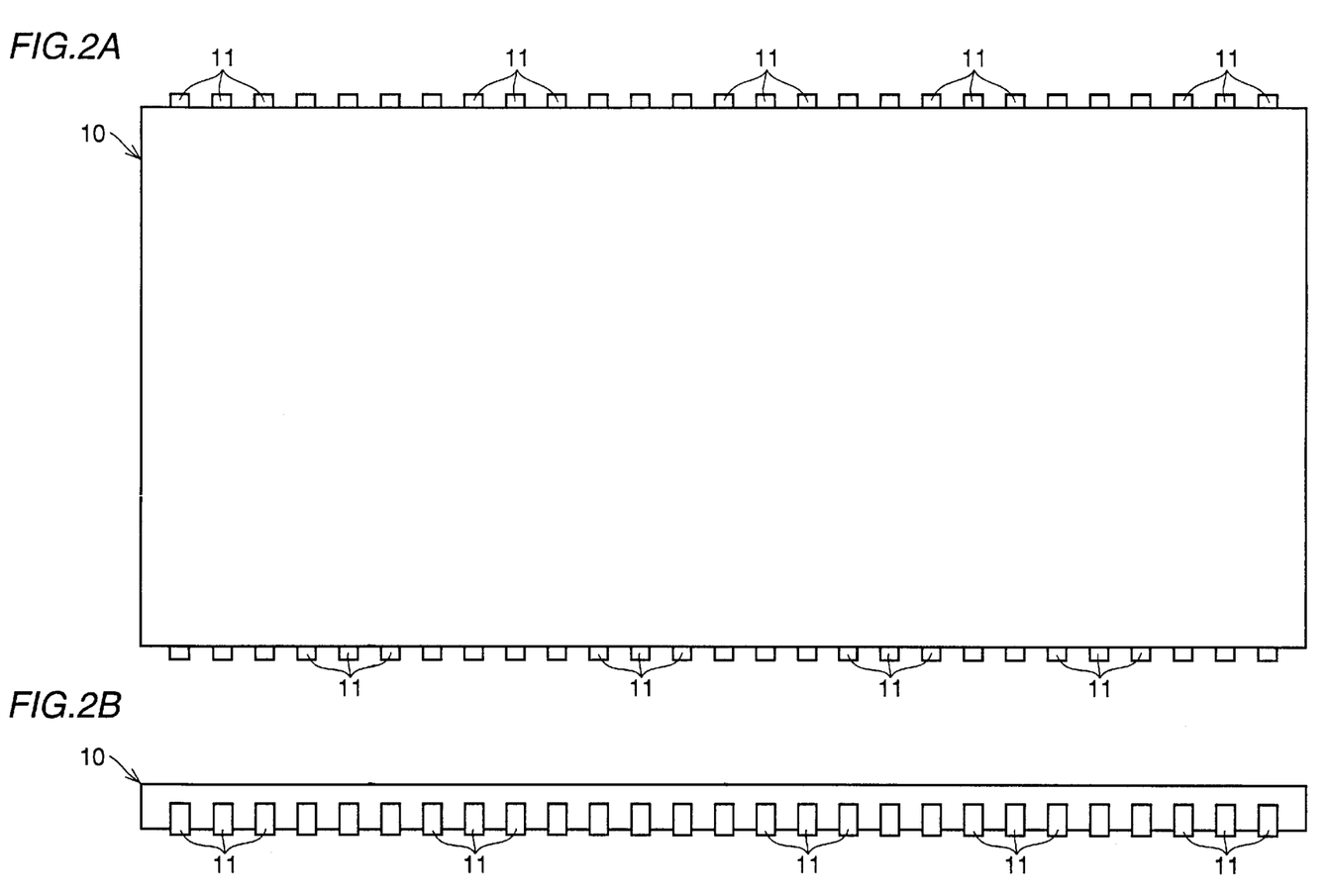
FIGS. 2A and 2B are plan and front views showing the outline of a package containing the DRAM chip shown in FIG. 1.
Figure 3A:
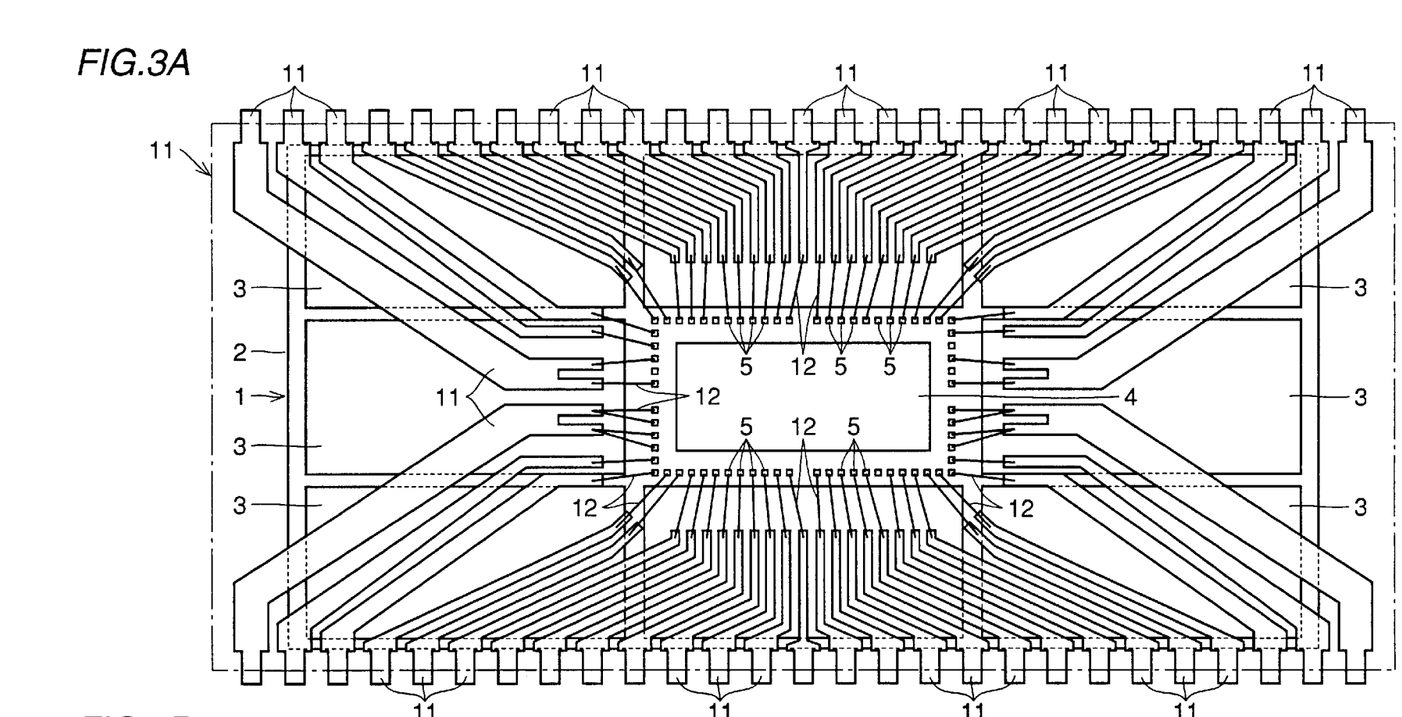
FIGS. 3A and 3B are plan and front views showing in detail the interior of the package shown in FIG. 2.
Figure 3B:
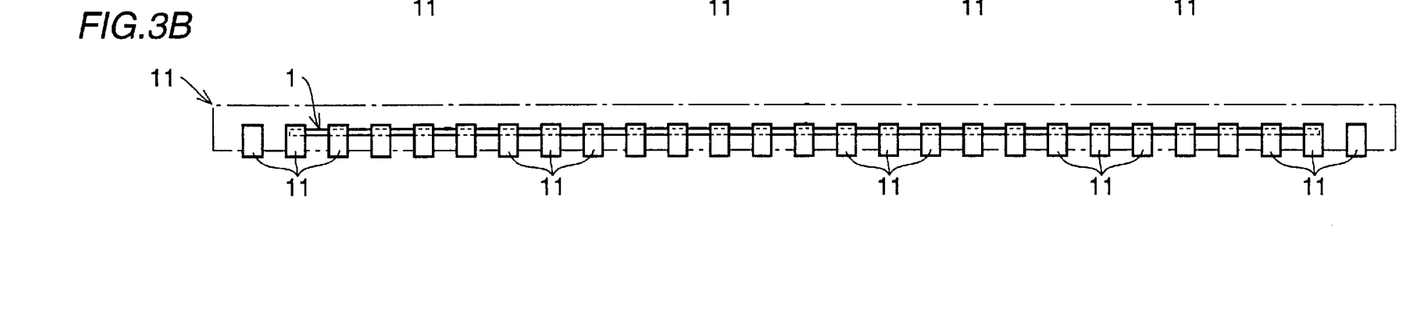

FIGS. 2A and 2B show the outline of a package 10 containing DRAM chip 1, and FIGS. 3A and 3B show the interior of package 10.

Referring to FIGS. 2A and 2B as well as FIGS. 3A and 3B, the aspect ratio of package 10 is approximately 1:2 as can be seen from above. DRAM chip 1 is contained inside package 10, and a plurality of lead frames 11 are radially arranged above DRAM chip 1.

The inner end of each lead frame 11 is connected through a bonding wire 12 to a pad 5, and the outer end of lead frame 11 is exposed to the outside from a longer side portion of package 11. A control signal and an address signal, for example, are input from the outside through lead frame 11 to DRAM chip 1, and read data is output from DRAM chip 1 through lead frame 11 to the outside.

Since other structure and operation are the same as a conventional DRAM, their description will not be repeated.

In this embodiment, the main surface of semiconductor substrate 2 having the aspect ratio of 1:2 is divided into 9 regions, subarray portions 3 each consisting of $2^{N-1} \times 2^N$ squares are arranged in eight regions other than the central region, and control circuitry 4 and pads 5 are converged and arranged in the central region. Therefore, the longitudinal and lateral sizes of chip 1 are determined only by the size of subarray portions 3, and the sizes of pad 5 and control circuitry 4 will not influence the longitudinal and lateral sizes of chip 1. Since the entire chip 1 has the aspect ratio of approximately 1:2, the effective ratio of the chip area to the package area can be raised when the chip is contained in package 10 having the aspect ratio of approximately 1:2. Consequently, a smaller package 10 can be used.

Figure 4:
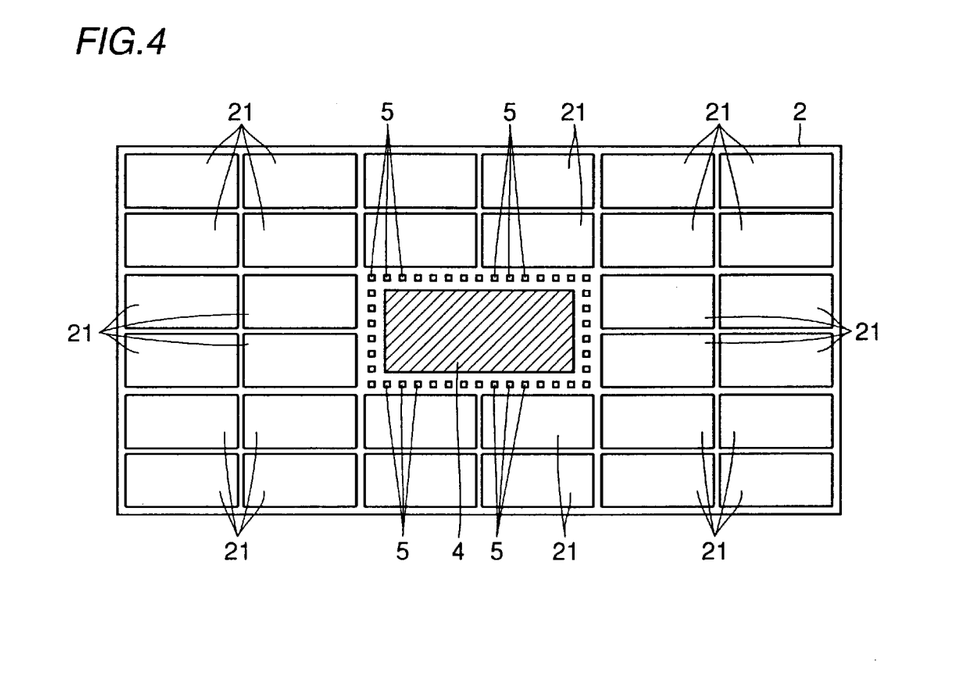
FIG. 4 shows an improvement of the DRAM chip shown in FIG. 1.
Figure 5:
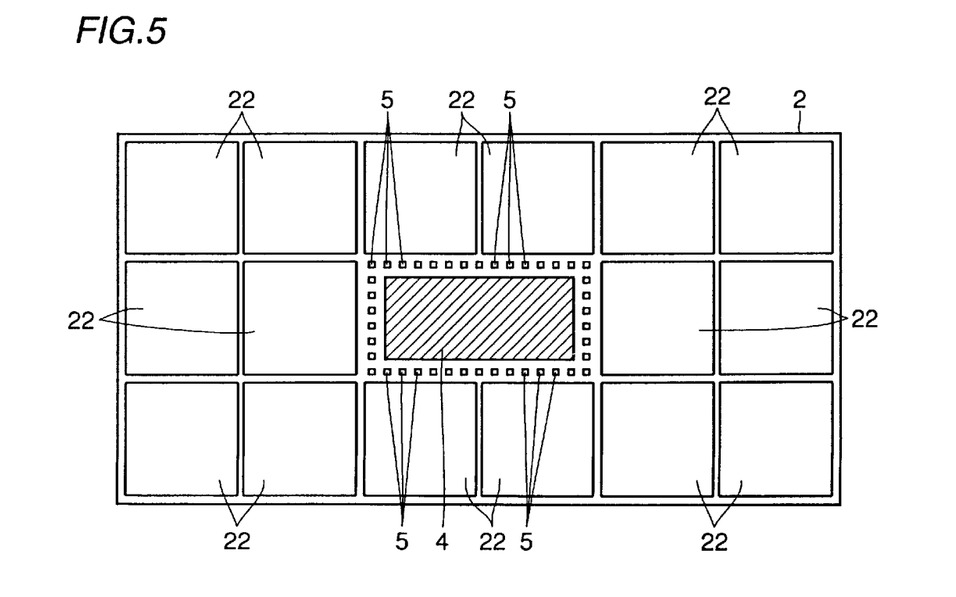
FIG. 5 shows another improvement of the DRAM chip shown in FIG. 1.
Figure 6:
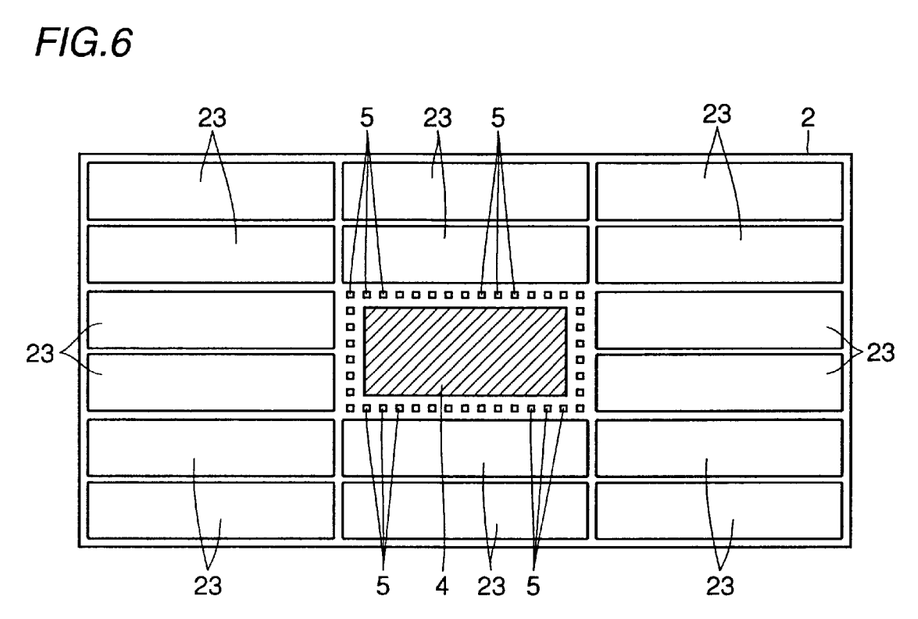
FIG. 6 shows still another improvement of the DRAM chip shown in FIG. 1.

Here, each subarray portion 3 may be divided into four subarray portions 21 each consisting of $2^{N-2} \times 2^{N-1}$ (longitudinal×lateral) squares with the area S, as shown in FIG. 4. Further, as shown in FIG. 5, each subarray portion 3 may be divided into two subarray portions 22 each consisting of $2^{N-1} \times 2^{N-1}$ squares. In addition, as shown in FIG. 6, each subarray portion 3 may be divided into two subarray portions 23 each having $2^{N-2} \times 2^N$ squares.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a storage capacity of $2^{2N+1}$ bits, comprising:

a rectangular semiconductor substrate having a main surface equally divided into 9 regions of 3 rows and 3 columns; and a memory array having a storage capacity of $2^{2N-2}$ bits and an aspect ratio of 1:2 and formed in each region of said 9 regions of said semiconductor substrate other than a central region.

2. The semiconductor memory device according to claim 1, wherein each said memory array is divided into a plurality of subarray portions.

3. The semiconductor memory device according to claim 1, further comprising:

control circuitry formed at a center of said central region of said semiconductor substrate for controlling said memory array; and a plurality of pads provided in a periphery of said central region of said semiconductor substrate for receiving and transmitting a signal between said control circuit and the outside.

4. The semiconductor memory device according to claim 3, wherein said semiconductor substrate has an aspect ratio of 1:2.

5. The semiconductor memory device according to claim 4, further comprising:

a package housing said semiconductor substrate and having an aspect ratio of 1:2.

6. The semiconductor memory device according to claim 5, further comprising:

a plurality of lead frames radially arranged from a periphery of said central region of said semiconductor substrate to a periphery of said package for receiving and transmitting said signal between said plurality of pads and the outside.

* * * * *